US011621395B2

(12) United States Patent
Strutt et al.

(10) Patent No.: US 11,621,395 B2
(45) Date of Patent: Apr. 4, 2023

(54) RESISTIVE RANDOM-ACCESS MEMORY DEVICES AND METHODS OF FABRICATION

(71) Applicant: Intel Corporation, Santa Clara, CA (US)

(72) Inventors: Nathan Strutt, Beaverton, OR (US); Albert Chen, Portland, OR (US); Pedro Quintero, Beaverton, OR (US); Oleg Golonzka, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 737 days.

(21) Appl. No.: 16/396,465

(22) Filed: Apr. 26, 2019

(65) Prior Publication Data

US 2020/0343445 A1    Oct. 29, 2020

(51) Int. Cl.
*H01L 45/00* (2006.01)
*G11C 13/00* (2006.01)
*H01L 27/24* (2006.01)

(52) U.S. Cl.
CPC ...... *H01L 45/1253* (2013.01); *G11C 13/0007* (2013.01); *H01L 45/08* (2013.01);
(Continued)

(58) Field of Classification Search
CPC ............ G11C 13/0007; G11C 13/0009; G11C 2213/30; G11C 2213/32; H01L 45/146; H01L 45/16
(Continued)

(56) References Cited

U.S. PATENT DOCUMENTS

2011/0006275 A1 * 1/2011 Roelofs ............... H01L 45/1233
                                                      257/E21.09
2011/0146775 A1 * 6/2011 Kim ................ H01L 31/035218
                                                      136/255
(Continued)

FOREIGN PATENT DOCUMENTS

| WO | 2081004697 | 1/2018 |
| WO | 2018022027 | 2/2018 |
| WO | 2019066849 | 4/2019 |

OTHER PUBLICATIONS

Notice of Allowance from European Patent Application No. 20163764.2 dated Feb. 24, 2022, 7 pgs.
(Continued)

*Primary Examiner* — Didarul A Mazumder
(74) *Attorney, Agent, or Firm* — Essential Patents Group, LLP

(57) ABSTRACT

A memory apparatus includes an interconnect in a first dielectric above a substrate and a structure above the interconnect, where the structure includes a diffusion barrier material and covers the interconnect. The memory apparatus further includes a resistive random-access memory (RRAM) device coupled to the interconnect. The RRAM device includes a first electrode on a portion of the structure, a stoichiometric layer having a metal and oxygen on the first electrode, a non-stoichiometric layer including the metal and oxygen on the stoichiometric layer. A second electrode including a barrier material is on the non-stoichiometric layer. In some embodiments, the RRAM device further includes a third electrode on the second electrode. To prevent uncontrolled oxidation during a fabrication process a spacer may be directly adjacent to the RRAM device, where the spacer includes a second dielectric.

20 Claims, 10 Drawing Sheets

(52) U.S. Cl.
CPC ........ *H01L 45/1233* (2013.01); *H01L 45/146* (2013.01); *H01L 45/16* (2013.01); *G11C 2213/15* (2013.01); *G11C 2213/32* (2013.01); *H01L 27/2436* (2013.01)

(58) Field of Classification Search
USPC .......................................................... 257/4
See application file for complete search history.

(56) References Cited

U.S. PATENT DOCUMENTS

| | | | |
|---|---|---|---|
| 2014/0301127 A1* | 10/2014 | Kim | G11C 13/0007 257/4 |
| 2016/0020388 A1* | 1/2016 | Wang | H01L 45/04 257/3 |
| 2018/0375024 A1* | 12/2018 | Chu | H01L 45/08 |
| 2019/0065752 A1* | 2/2019 | Li | G06F 1/3296 |
| 2020/0106011 A1* | 4/2020 | Chen | H01L 27/2436 |

OTHER PUBLICATIONS

Extended European Search Report from European Patent Application No. 20163764.2 dated Aug. 19, 2020, 7 pgs.

\* cited by examiner

RESISTIVE RANDOM-ACCESS MEMORY DEVICES AND METHODS OF FABRICATION

BACKGROUND

For the past several decades, feature size reduction has been a key focus for industrial-scale semiconductor process development. Scaling to smaller dimensions enables a higher density of functional elements per chip, smaller chips, and also reduced cost. However, as the industry approaches the physical limits of traditional scaling, it is becoming increasingly important to look for non-traditional types of devices that can offer new functionality. One such example is non-volatile memory based on resistive random-access memory (RRAM) devices.

Non-volatile on-chip embedded memory with resistive random-access memory (RRAM) devices can improve energy and computational efficiency of a system on chip (SOC). However, the technical challenges of creating an appropriate stack for fabrication of RRAM devices with high device endurance present formidable roadblocks to commercialization of this technology. Specifically, endurance refers to long term repeated switching of an RRAM device between high and low resistance state with minimal variation in switching parameters. It is high desirable for a large number of individual RRAM devices to switch repeatedly within a given voltage and current range for functional embedded memory applications. As such, significant improvements are still needed in engineering material layer stacks for endurance improvement in RRAM devices.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Also, various physical features may be represented in their simplified "ideal" forms and geometries for clarity of discussion, but it is nevertheless to be understood that practical implementations may only approximate the illustrated ideals. For example, smooth surfaces and square intersections may be drawn in disregard of finite roughness, corner-rounding, and imperfect angular intersections characteristic of structures formed by nanofabrication techniques. Further, where considered appropriate, reference labels have been repeated among the figures to indicate corresponding or analogous elements.

DESCRIPTION OF EXEMPLARY EMBODIMENTS

Figure 1A:
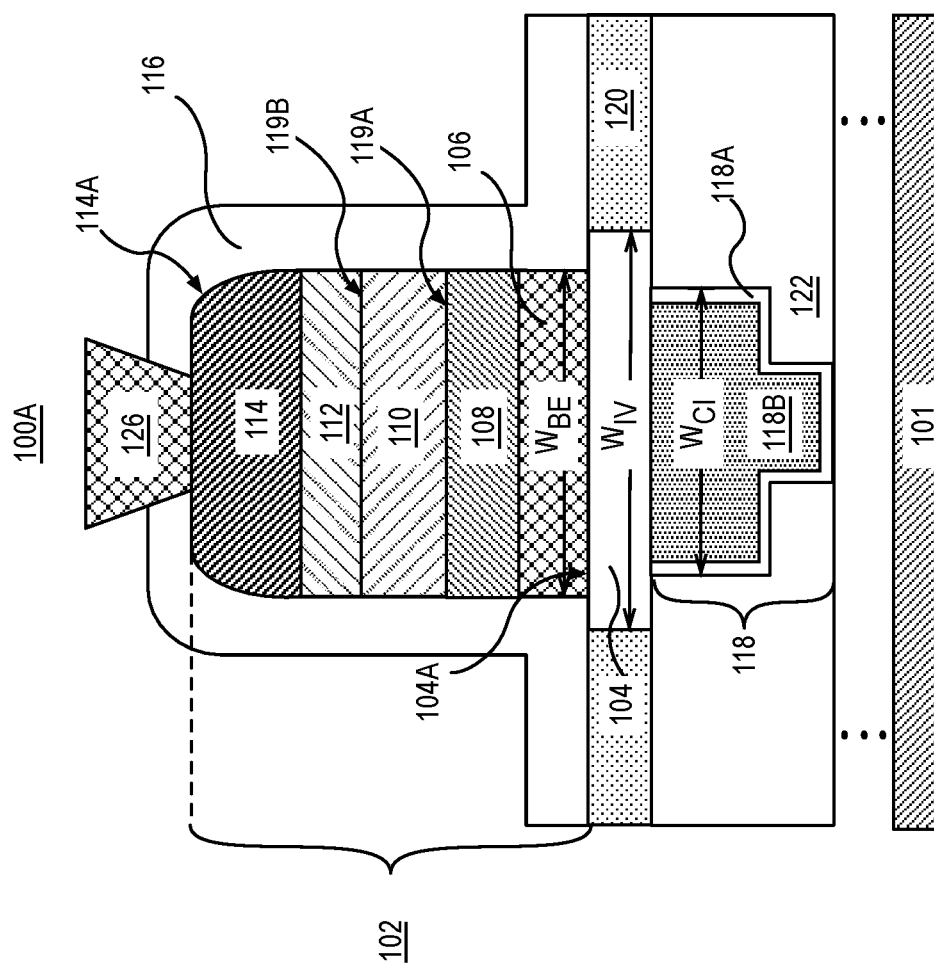
FIG. 1A illustrates a cross-sectional view of an RRAM device including a non-stoichiometric layer, in accordance with an embodiment of the present disclosure.

A resistive random-access memory (RRAM) device and methods of fabrication are described. In the following description, numerous specific details are set forth, such as structural schemes and detailed fabrication methods in order to provide a thorough understanding of embodiments of the present disclosure. It will be apparent to one skilled in the art that embodiments of the present disclosure may be practiced without these specific details. In other instances, well-known features, such as transistor operations and switching operations associated with embedded memory, are described in lesser detail in order to not unnecessarily obscure embodiments of the present disclosure. Furthermore, it is to be understood that the various embodiments shown in the Figures are illustrative representations and are not necessarily drawn to scale.

In some instances, in the following description, well-known methods and devices are shown in block diagram form, rather than in detail, to avoid obscuring the present disclosure. Reference throughout this specification to "an embodiment" or "one embodiment" or "some embodiments" means that a particular feature, structure, function, or characteristic described in connection with the embodiment is included in at least one embodiment of the disclosure. Thus, the appearances of the phrase "in an embodiment" or "in one embodiment" or "some embodiments" in various places throughout this specification are not necessarily referring to the same embodiment of the disclosure. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, magnetic or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example, in the context of materials, one material or material disposed over or under another may be directly in contact or may have one or more intervening materials. Moreover, one material disposed between two materials may be directly in contact with the two layers or may have one or more intervening layers. In contrast, a first material "on" a second material is in direct contact with that second material/material. Similar distinctions are to be made in the context of component assemblies. As used throughout this description, and in the claims, a list of items joined by the term "at least one of" or "one or more of" can mean any combination of the listed terms.

The term "adjacent" here generally refers to a position of a thing being next to (e.g., immediately next to or close to with one or more things between them) or adjoining another thing (e.g., abutting it).

The term "signal" may refer to at least one current signal, voltage signal, magnetic signal, or data/clock signal. The meaning of "a," "an," and "the" include plural references. The meaning of "in" includes "in" and "on."

The term "device" may generally refer to an apparatus according to the context of the usage of that term. For example, a device may refer to a stack of layers or structures, a single structure or layer, a connection of various structures having active and/or passive elements, etc. Generally, a device is a three-dimensional structure with a plane along the x-y direction and a height along the z direction of an x-y-z Cartesian coordinate system. The plane of the device may also be the plane of an apparatus which comprises the device.

Here, an in-plane magnet refers to a magnet that has magnetization in a direction substantially along the plane of the magnet. For example, a magnet with a magnetization which is in an x or y direction and is in a range of 0 (or 180 degrees)+/−20 degrees relative to an x-y plane of a device.

The term "free" or "unfixed" here with reference to a magnet refers to a magnet whose magnetization direction can change along its easy axis upon application of an external field or force (e.g., Oersted field, spin torque, etc.). Conversely, the term "fixed" or "pinned" here with reference to a magnet refers to a magnet whose magnetization direction is pinned or fixed along an axis and which may not change due to application of an external field (e.g., electrical field, Oersted field, spin torque).

As used throughout this description, and in the claims, a list of items joined by the term "at least one of" or "one or more of" can mean any combination of the listed terms. Unless otherwise specified in the explicit context of their use, the terms "substantially equal," "about equal" and "approximately equal" mean that there is no more than incidental variation between two things so described. In the art, such variation is typically no more than +/−10% of a predetermined target value.

The terms "left," "right," "front," "back," "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. In the context of materials, one material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies.

The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

Integration of a memory array with low voltage logic circuitry, such as logic circuitry operational at a voltage less than or equal to 1 Volt, may be advantageous since it enables higher operation speeds compared to having physically separate logic and memory chips. Additionally, approaches to integrating an RRAM device with a transistor to create embedded memory presents material challenges that have become far more formidable with scaling. As transistor operating voltages are scaled down in an effort to become more energy efficient, RRAM memory devices that are connected in series with such transistors are also required to function at lower voltages and currents.

Non-volatile memory devices, such as resistive random-access memory (RRAM) devices, depend on a phenomenon of resistance switching to store information. The non-volatile memory device functions as a variable resistor where the resistance of the device may switch between a high resistance state and a low resistance state. Resistance switching relies on a change in conductivity of the RRAM device. In particular, a switching layer determines the conductivity. In one embodiment, the conductivity is modulated by formation and dissolution of a conductive filament in the switching layer.

The conductive filament may be created in an RRAM device by a one-time electro-forming process, where a voltage is applied between two electrodes located on either side of the switching layer. The electro-forming process may cause an electrical breakdown within the switching layer leading to a formation of the conductive filament. The electro-forming voltage depends on the material composition, thickness and quality of the switching layer and can dictate a size of the conductive filament being formed within the switching layer. A low electro-forming voltage is desirable as it creates a conductive filament that supports low current to switch an RRAM device between a high and a low resistance state. A low current operation is desirable from a power savings perspective. In some embodiments, the electro-forming voltage may be reduced by inserting an oxygen exchange layer between the switching layer and an electrode.

The oxygen exchange layer may be a metal that acts as a source or sink of oxygen vacancies. However, during the fabrication process, sidewall portions of the oxygen exchange layer may become damaged and oxidized. During operation, the inventors have found that while RRAM device with a metal oxygen exchange layer may enable formation of form conductive filaments at low electro-forming voltages, the RRAM devices suffer from retention failures. An example of retention failure observed is a drifting of the resistance level of a RRAM device from a programmed low resistance level to a level above a predetermined reference level over a 24-hour time period. The inventors believe that the oxygen exchange layer may suffer from oxidation during the fabrication process for reliable device operation. When oxidation of a metal oxygen exchange layer is not uniform a non-uniform partially oxidized metal film may be formed. Sidewall portions of the oxygen exchange layer may be particularly vulnerable to non-uniform partial oxidation. The non-uniformity of a partially oxidized oxygen exchange layer can lead to a high level of variability in device performance.

Increasing the size of the conductive filament formed during the electro-forming process may mitigate variability. However, during the process of resistance switching a larger conductive filament may require a larger electrical current to dissolve and re-form compared to a relatively smaller conductive filament. A low current operation is desirable for embedded memory applications where the RRAM device may be coupled to a transistor. The maximum current delivered by the transistor to the RRAM device may not meet the threshold current requirement for filament formation and dissolution if the conductive filament formed during the electro-forming process becomes too large in size. In examples, where the transistor threshold current is not a limitation, increasing filament size can also lead to endurance problems. Endurance problem may be defined as the number of switching cycles that an RRAM device can complete before it is stuck in the high resistance state.

The inventors have found that the problems associated with uncontrolled partial oxidation may be solved by replacing a metal oxygen exchange layer with a non-stoichiometric layer. The non-stoichiometric layer may include a metal and oxygen where the metal to oxygen ratio is not stoichiometrically proportional. The non-stoichiometric layer may include a same metal as the metal of the switching layer for added benefits such as retention improvement.

In accordance with an embodiment of the present disclosure, a memory apparatus includes an interconnect in a first dielectric above a substrate and a structure above the interconnect, where the structure includes a diffusion barrier material and covers the interconnect. The memory apparatus further includes a resistive random-access memory (RRAM) device coupled to the interconnect. The RRAM device includes a first electrode on a portion of the structure, a stoichiometric layer having a metal and oxygen on the first electrode, a non-stoichiometric layer including the metal and oxygen on the stoichiometric layer. A second electrode including a barrier material is on the non-stoichiometric layer. In some embodiments, the RRAM device further includes a third electrode for fabrication advantages on the second electrode. To prevent uncontrolled oxidation during a fabrication process a spacer may be directly adjacent to the RRAM device, where the spacer includes a second dielectric.

FIG. 1A illustrates a cross-sectional illustration of a memory apparatus 100A above a substrate 101. As shown, memory apparatus 100A includes an RRAM device 102 on a portion of a structure 104. The structure 104 includes a diffusion barrier material, (herein referred to as electrode 104). The RRAM device 102 includes a bottom electrode 106, and a stoichiometric layer 108 on the bottom electrode 106. The stoichiometric layer 108 supports a conductive filament during operation and is herein referred to as switching layer 108. The switching layer 108 includes a metal and oxygen in substantially stoichiometric proportions. The RRAM device 102 further includes a non-stoichiometric layer 110 including the metal and oxygen on the switching layer 108, an electrode 112 on the non-stoichiometric layer 110 and a top electrode 114 on the electrode 112. In the illustrative embodiment, the memory apparatus 100A further includes a spacer 116 directly adjacent to the RRAM device, where the spacer 116 includes a dielectric, and a conductive interconnect 118 directly below and coupled with the barrier electrode 104.

In an embodiment, the bottom electrode 106 includes a noble metal. The noble metals Ir, Pt and Pd provide excellent resistance to oxidation. However, a ruthenium bottom electrode 106 may oxidize and remain conductive with no adverse effect to the RRAM device 102.

In an exemplary embodiment, the switching layer 108 includes oxygen and tantalum. When the switching layer 108 includes a metal such as tantalum having an oxidation state +5, the switching layer 108 has a chemical composition of $Ta_2O_5$. The thickness of the switching layer 108 may vary on the desired voltage operating range. In one embodiment, the switching layer 108 has a thickness of at least 1 nm. In exemplary embodiments, the switching layer 108 has a thickness between 2 nm and 5 nm. The magnitude of the electro-forming voltage, discussed above, is proportional to a thickness of the switching layer 108. In some embodiments, the switching layer 108 includes a stoichiometric oxide that may not be structurally homogenous across the cross-sectional plane in FIG. 1A. For example, a portion of the switching layer 108 inside a sidewall 108A may have lattice dislocations, indicative of damage during the fabrication process.

The non-stoichiometric layer 110 acts as a source of oxygen vacancies or as a sink for oxygen atoms in filamentary RRAM devices and is herein referred to as oxygen exchange layer 110. The oxygen vacancies migrate to and from the oxygen exchange layer 110 into the switching layer 108, in response to an applied voltage between the top electrode 114 and bottom electrode 106. Migration of oxygen vacancies enable resistance switching in the RRAM device 100A. In an exemplary embodiment, the oxygen exchange layer 110 includes tantalum and oxygen for example, $Ta_X O_Y$, where O is oxygen and wherein the ratio between X and Y is between 1:0.8 to 1:1.2. In some embodiments, the ratio between X and Y is substantially close to 1:0.8. In other embodiments, the ratio between X and Y is substantially close to 1:1.2. In an embodiment, the oxygen exchange layer 110 has a thickness between 5 nm and 20 nm. The thickness may depend on the ratio between X and Y in $Ta_x O_y$. In an embodiment, the oxygen exchange layer 110 has a gradient in oxygen concentration. The concentration of oxygen may decrease from an interface 119A between the switching layer 108 and the oxygen exchange layer 110 toward interface 119B between the oxygen exchange layer 110 and the electrode 112. The oxygen gradient may such that the ratio between X and Y in $Ta_x O_y$ at interface 119A is substantially close to 1:1.2 and the ratio between X and Y in $Ta_x O_y$ at interface 119B is substantially close to 1:0.8.

In an embodiment, the electrode 112 includes ruthenium, platinum, iridium, palladium, tungsten, tantalum or an alloy including nitrogen and at least one of Ta, Ti or W. The electrode 112 has a thickness between 2 nm and 10 nm and may depend on the material. In some embodiments, metals that are difficult to pattern for example, Pt, Ir, Pd have a thickness that is 5 nm or less.

In an embodiment, the top electrode 114 includes a metal such as Ta, Ti or W or an alloy including nitrogen and at least one of Ta, Ti or W. The top electrode 114 has a thickness that is between 20 nm and 50 nm. In some embodiments, such as is illustrated, the top electrode 114 has a curved outermost surface 114A.

In an embodiment, the electrode 104 includes an alloy including nitrogen and at least one of Ta, Ti or W. The electrode 104 has a cross-sectional width, $W_{IV}$, as shown. In the illustrative embodiment, $W_{IV}$ is greater than a cross-sectional width, $W_{BE}$ of the bottom electrode 106. In some embodiments, $W_{IV}$ may also be less than $W_{BE}$. In embodiments, when $W_{IV}$ is less than $W_{BE}$, the RRAM device 102 has portions on a dielectric 120 laterally adjacent to electrode 104.

Conductive interconnect 118 may include lateral runs (e.g., metallized trenches) and vertical runs (e.g., metallized vias). As shown, the metallization structure 118 has an uppermost surface that is coplanar or substantially co-planar with an uppermost surface of an adjacent dielectric 122. In an embodiment, the metallization structure 118 includes a barrier layer 118A, and a fill metal 118B on the barrier layer 118A. In an embodiment, the barrier layer 118A includes tantalum nitride, tantalum or ruthenium. In an embodiment, the fill metal 118B includes W, Co, Ni or Cu. In the illustrative embodiment, for example, a width, $W_{CI}$ of the metallization structure 118 is representative of the largest dimension of the metallization structure 118, within the cross-sectional plane of the RRAM device 100A. In exemplary embodiments, $W_{CI}$ is less than $W_{IV}$. In some embodiments, the $W_{CI}$ is substantially similar to $W_{IV}$. In some such embodiments, the electrode 104 covers the conductive interconnect 118.

The spacer 116 may be utilized to prevent uncontrollable oxidation of one or more layers in the RRAM device 100A. As shown, the spacer 116 is adjacent to outer most surface 114 of the top electrode include sidewall portions and a top surface.

As shown, when $W_{BE}$ is less than $W_{IV}$, the spacer 116 is also on a portion of the electrode 104. The dielectric liner has a composition that is substantially free of metal. In an exemplary embodiment, the dielectric liner includes silicon and nitrogen.

In the illustrative embodiment, the memory apparatus 100A includes a metallization contact 126. The metallization contact 126 may include a barrier layer and a fill material. In an embodiment, the composition of the barrier layer and the fill material may be substantially the same as the barrier layer 118A and the fill metal 118B.

In an embodiment, RRAM device 102 is scaled laterally in size and approach a lateral thickness (along the Y-axis) of the metallization contact 126. In such an embodiment, any misalignment between the metallization contact 126 and the RRAM device 100A may cause portions of the metallization contact 126 to extend along a section of the outermost surface 114A and down a sidewall of the RRAM device 102. For advantageous device operation, a lowermost portion of the metallization contact 126 should not extend below the oxygen exchange layer 110.

In some such embodiments, the top electrode 114 includes a conductive material that is relatively easy to pattern and is substantially thicker than 10 nm. The top electrode 114 may be between 50 nm-100 nm, in some examples, which provides sufficient thickness as an intermediate layer for coupling with the metallization contact 126 above.

In an embodiment, the dielectric 120 and 122 include silicon and at least one of oxygen, carbon or nitrogen. In one embodiment, dielectric 120 includes silicon and nitrogen and dielectric 122 includes silicon, oxygen and nitrogen. In a different embodiment dielectric 120 includes silicon and nitrogen and dielectric 122 includes silicon, and oxygen.

In an embodiment, the substrate 101 includes a suitable semiconductor material such as but not limited to, single crystal silicon, polycrystalline silicon and silicon on insulator (SOI). In another embodiment, substrate 101 includes other semiconductor materials such as germanium, silicon germanium or a suitable group III-N or a group III-V compound. Logic devices such as MOSFET transistors and access transistors and may be formed on the substrate 101. Logic devices such as access transistors may be integrated with plurality of memory apparatus each including RRAM device 102 to form embedded memory. Embedded memory including RRAM devices and logic MOSFET transistors may be combined to form functional integrated circuit such as a system on chip.

In some embodiments, the bottom electrode 104 and the electrode 112 include a noble metal and top electrode 104 includes a metal having an affinity for oxygen. In some such embodiments, portions inside a sidewall of the top electrode 114 may include oxygen.

Figure 1C:
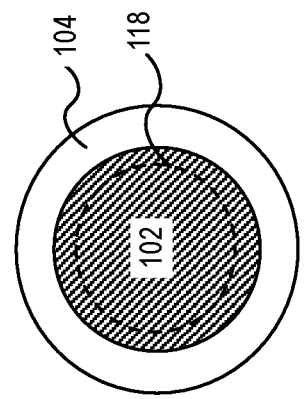
FIG. 1C illustrates a plan-view of the RRAM device in FIG. 1A, in accordance with an embodiment of the present disclosure.
Figure 1B:
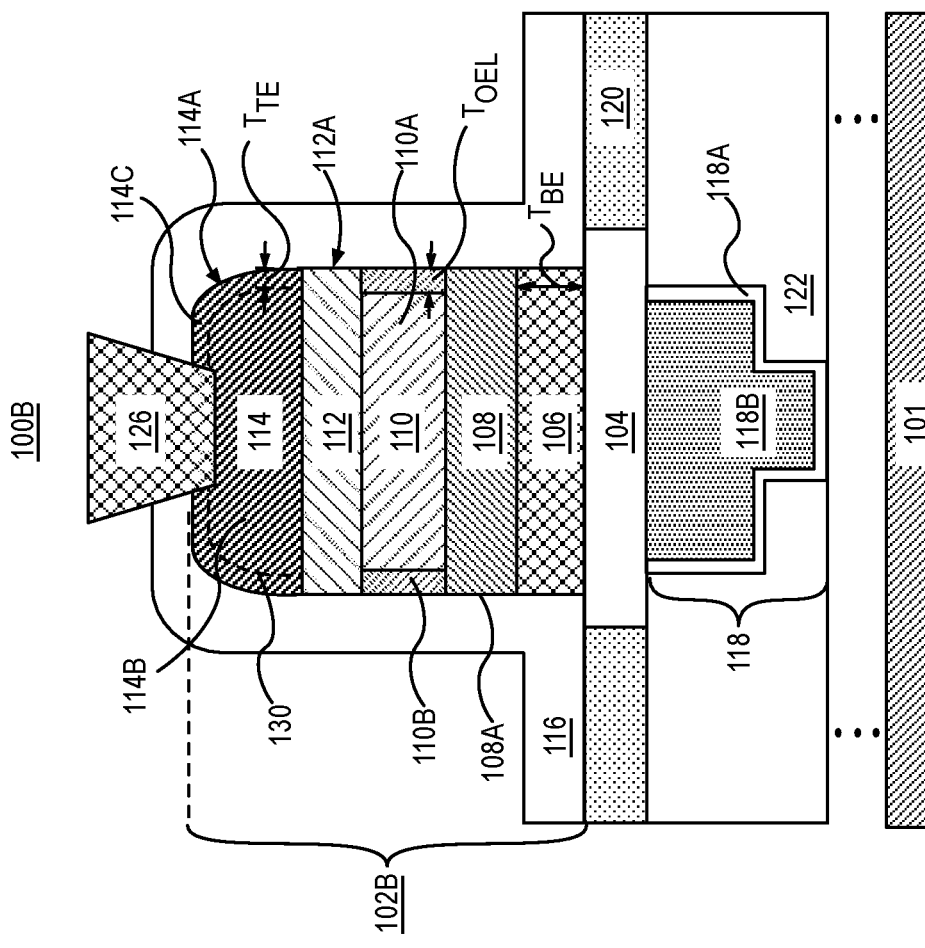
FIG. 1B illustrates a cross-sectional view of a RRAM device including sidewall portions that include oxygen, in accordance with an embodiment of the present disclosure.

FIG. 1B includes a cross sectional illustration of a memory apparatus 100B where the bottom electrode 106 and the electrode 112 include a noble metal. In an exemplary embodiment, bottom electrode includes Ru, the electrode 112 includes a noble metal and the top electrode 114 includes at least one of Ta, TaN, TiN. In one such exemplary embodiment, the top electrode 114 has a top electrode portion 114B and a top electrode portion 114C adjacent to the top electrode portion 114B. As shown, the top electrode portion 114C is between the dashed line 130 and the outer surface 114A. The top electrode portion 114B includes tantalum and top electrode portion 114C includes tantalum and oxygen. In an embodiment, the top electrode portion 114C has an oxygen concentration that is substantially uniform. In an embodiment, the top electrode portion 114C has a lateral thickness, $T_{TE}$, that is between 2 nm-5 nm (across the cross-sectional plane in the Y-direction). The top electrode portion 114C may have a lateral thickness, $T_{TE}$, that correlates with a vertical thickness, $T_{BE}$, of the bottom electrode. For example, the greater $T_{BE}$ is, the greater is $T_E$.

In an embodiment, when the bottom electrode includes Ru, the oxygen exchange layer 110 includes an inner portion 110A and an outer portion 110B adjacent to the inner portion, as shown. In an embodiment, the inner portion is substantially non-stoichiometric and the outer portion is substantially stoichiometric. In the illustrative embodiment, where the oxygen exchange layer 110 has a chemical composition of $Ta_X O_Y$, the ratio between X and Y in the inner portion 110A is between between 1:0.8 to 1:1.2. In one such embodiment, the outer portion 110B has a chemical composition that is $Ta_2O_5$. In an embodiment, the outer portion 110B has a chemical composition that is substantially the same as the chemical composition of the switching layer 108. In an embodiment, outer portion 110B has a lateral thickness, $T_{OEL}$ in a cross-sectional plane of FIG. 1B that is between 1 nm and 3 nm. In an embodiment, $T_{OEL}$ correlates with $T_{BE}$. For example, the greater $T_{BE}$ is, the greater is $T_{OEL}$. A bottom electrode including Ru, may have a thickness $T_{BE}$ that ranges between 5 nm and 10 nm.

In some embodiments, top electrode portion 114A adds undesirable electrical resistance to the RRAM device. Added electrical resistance increases the burden on applied voltage during operation. In some such embodiments, the contact metallization structure 126 extends into the conductive top electrode portion 114B (inside dashed line 130), as shown.

FIG. 1C illustrates a plan-view of the RRAM device in FIG. 1B, in accordance with an embodiment of the present disclosure. The areas of the various layers shown represent a lowermost surface of the electrode 104 and an uppermost surface of the conductive interconnect 118. The spacer 116 and metallization contact 126 are not shown for clarity. As shown, the electrode 104 has a lowermost surface area that is greater than a lowermost surface area of the conductive interconnect 118 (inside dashed lines). The electrode 104 also covers the conductive interconnect 118, as shown. A plan view area of a lowermost surface of the RRAM device 102 is also shown in the Figure. In the illustrative embodiment, the RRAM device 102 has a lowermost surface area that is less than the lowermost surface area of the electrode 104.

Figure 2:
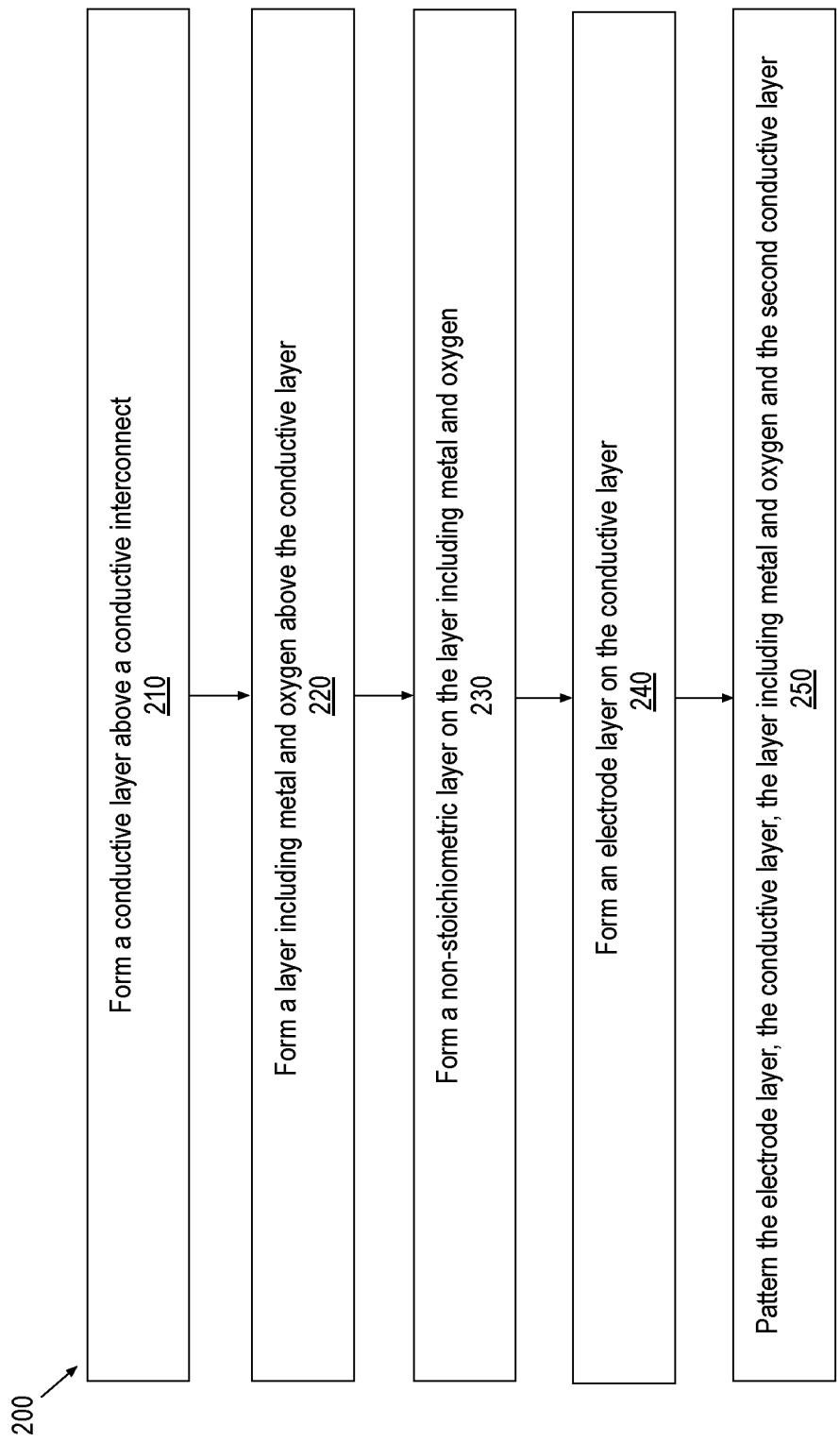
FIG. 2 illustrates a flow chart for a method to fabricate an RRAM device, in accordance with an embodiment of the present disclosure.

FIG. 2 illustrates a flow chart for a method to fabricate an RRAM device, in accordance with an embodiment of the present disclosure. In an embodiment, the method 200 begins in operation 210 by forming a conductive layer above a conductive interconnect. The method 200 continues in operation 220 by forming a layer including oxygen and a metal on the conductive layer. The method 200 continues in operation 230 by forming a non-stoichiometric layer on the layer including oxygen and metal. The method 200 continues in operation 240 by forming an electrode layer on the non-stoichiometric layer. The method 200 continues in operation 250 by patterning the electrode layer, the non-stoichiometric layer, the layer including oxygen and metal, and the conductive layer to form a structure having sidewalls.

FIGS. 3A-3F illustrate cross-sectional views of the memory apparatus 100A illustrated in FIG. 1A evolving as a fabrication method, such as method 200, is practiced.

Figure 3B:
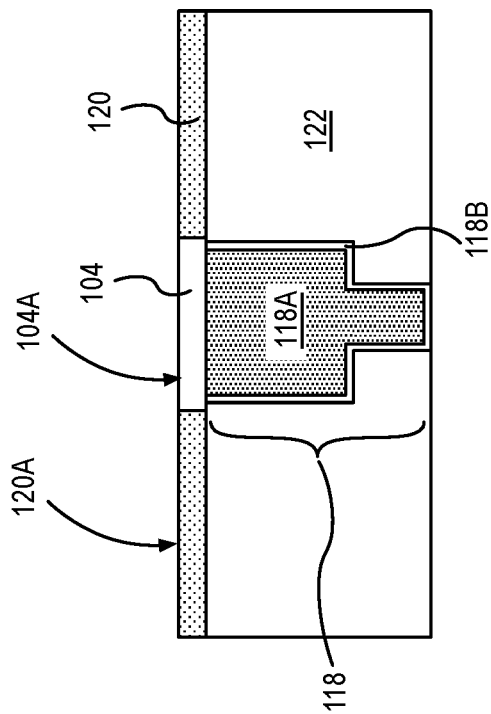
FIG. 3B illustrates the structure of FIG. 3A following a process to planarize the first dielectric and portions of the electrode.
Figure 3A:
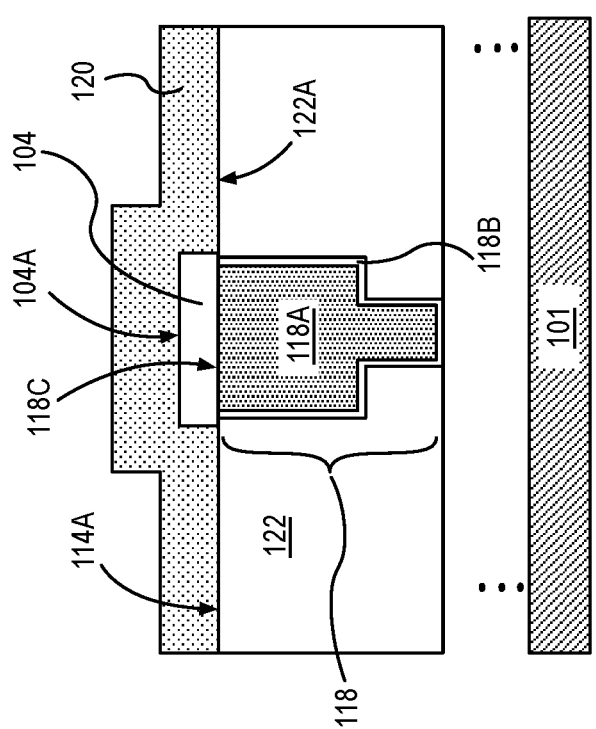
FIG. 3A illustrates an electrode on a metallization structure that is formed above a substrate and a first dielectric on the electrode.

FIG. 3A illustrates a metallization structure 118 surrounded by a dielectric 122 formed above a substrate 101. In an embodiment, the metallization structure 118 is formed in a dielectric 122 by a damascene or a dual damascene process. In an embodiment, the metallization structure 118 includes a barrier layer, such as ruthenium, titanium nitride, ruthenium, tantalum or tantalum nitride, and a fill metal, such as cobalt, nickel, copper or tungsten. In an embodiment, the metallization structure 118 is fabricated using a subtractive etch process when materials other than copper are utilized. In some examples, the dielectric 122 includes a silicon and at least one or nitrogen, oxygen or carbon. In an embodiment, the dielectric 122 has an uppermost surface 122A that is substantially co-planar with an uppermost surface 118C of the metallization structure 118. In some examples, metallization structure 118 may be electrically connected to a circuit element such as an access transistor (not shown). Logic devices such as access transistors may be integrated with memory devices such as a RRAM device to form embedded memory.

FIG. 3A also illustrates an electrode 104 formed above the conductive interconnect 118. In an embodiment, a conductive layer including a diffusion barrier material is blanket deposited on the uppermost surfaces 118C and 122A. In an embodiment, the conductive layer is patterned by forming a mask on the conductive layer and performing a plasma etch process to form electrode 104. A dielectric 120 is blanket deposited on the surface 104A of the electrode 104 and on the dielectric surface 122A. In an embodiment, the dielectric 120 is blanket deposited using a physical vapor deposition (PVD) or a chemical vapor deposition (CVD), or a plasma enhanced chemical vapor deposition (PECVD) process.

FIG. 3B illustrates the structure of FIG. 3A following a process to planarize the first dielectric and portions of the electrode. In an embodiment, the planarization includes a chemical mechanical polish (CMP) process. In the illustrative embodiment, CMP process is utilized to planarize the dielectric 120 and portions of the electrode 104 to form uppermost surfaces 104A and 120A that are substantially co-planar as shown.

FIG. 3B illustrates the structure of FIG. 3A following the formation of a material layer stack 300 utilized in the formation of an RRAM device, on a dielectric surface 120A and on the electrode surface 104A. In 1 an embodiment, a conductive layer 301 is blanket deposited by a physical vapor deposition (PVD), a chemical vapor deposition (CVD), a plasma enhanced chemical vapor deposition (PECVD) or an atomic layer deposition process (ALD). In an embodiment, the conductive layer 301 includes noble metals Ir, Pt, Pd or Ru. The choice of materials utilized to form the conductive layer 301 results in conductive layer 301 having a low electrical resistivity, such as an electrical resistivity between 100-250 μ-Ω-cm.

In an embodiment, the conductive layer 301 may be planarized before deposition of additional layers of the material layer stack 300. Planarization may enable the top surface 301A of the conductive layer 301 to have a surface roughness that is less than 1 nm. A surface roughness of less than 1 nm enables a layer 303 having a uniform thickness to be deposited on surface of the conductive layer 301. A uniform thickness in the layer 303 is desirable to reduce variation in forming voltage in a large collection of RRAM devices. In an embodiment, the layer 303 includes a material is the same or substantially the same as the material of the switching layer 108.

In other embodiments, a stoichiometric layer 303 is deposited on the conductive layer 301 without breaking vacuum, as shown. In an embodiment, the stoichiometric layer 303 is a material that includes oxygen and tantalum having a composition $Ta_2O_5$. The stoichiometric layer 303 may be formed using an atomic layer deposition (ALD) process. The ALD process may be characterized by a slow and a controlled deposition rate resulting in a metal oxide film with a stoichiometric oxygen content. In some embodiments, the stoichiometric layer 303 is deposited using a physical vapor deposition (PVD) process. The PVD process may include depositing a metal oxide film in an ambient containing oxygen flowing at a constant rate. The stoichiometric layer 303 is deposited to a thickness between 2 nm and 5 nm.

The deposition method is continued with the formation of a non-stoichiometric layer 305 on the stoichiometric layer 303. The PVD process may include depositing a metal oxide film in an ambient containing oxygen flowing at a constant rate. The deposition process may form a non-stoichiometric layer 305 that is slightly deficient in oxygen concentration resulting in a film that is deficient in oxygen content. In some such embodiments, the non-stoichiometric layer 305 has an oxygen concentration gradient with higher concentration of oxygen proximate to the stoichiometric layer surface 303A and a lower concentration of oxygen distal from a conductive layer surface 307A. Such an arrangement may preferably provide greater oxygen vacancies in a location that aids with filament formation and dissolution.

The non-stoichiometric layer 305 may include a material having a composition and a thickness, such as is described above in association with the oxygen exchange layer 110 such as $Ta_xO_y$. Utilizing a metal that is the same as the metal of the stoichiometric layer 303 enables an upper portion of the stoichiometric layer 303 to maintain oxygen vacancies after an anneal process (to be described further below). The presence of oxygen vacancies may reduce the electro-forming voltage during operation. In an embodiment, the non-stoichiometric layer 305 is blanket deposited on the stoichiometric layer 303, for example, using a PVD process.

The deposition method is continued with the formation of the conductive layer 307 on the non-stoichiometric layer 305. In an embodiment, the conductive layer 307 includes a material that is the same as or substantially the same as the material of the electrode 112 (described in association with FIG. 1A). Referring again to FIG. 3C. The conductive layer 307 may be deposited using a PVD process. In one example the conductive layer 307 and the non-stoichiometric layer 305 are deposited sequentially in a same chamber or in a same tool without breaking vacuum. Sequential deposition without an air-break may prevent an uppermost portion of the non-stoichiometric layer 305 from becoming stoichiometric. Oxidation of the non-stoichiometric layer 305 can introduce variability in electro-forming voltage and variability in switching voltages during RRAM device operation. In some embodiments, the conductive layer 307 includes a metal of the stoichiometric layer 303 and the metal of the non-stoichiometric layer 305, i.e. Ta.

The conductive layer 307 is utilized as a work function electrode and may include a material that is substantially difficult to pattern when deposited to a thickness greater than 5 nm. In some such embodiments, the conductive layer 307 is deposited to a thickness of approximately 10 nm and a top electrode layer 309 is deposited on the conductive layer 307. Portions of the top electrode layer 309 may be sacrificed during subsequent processing operations. In an embodiment, the top electrode layer 309 is blanket deposited using one of the deposition processes described above. The top electrode layer 309 is deposited to a thickness between 20 nm and 100 nm. In some embodiments, the top electrode layer 309 includes a metal of the stoichiometric layer 303 and the metal of the non-stoichiometric layer 305, i.e. Ta. In other embodiments, the top electrode layer 309 and the conductive layer 307 each includes a metal of the stoichiometric layer 303 and the metal of the non-stoichiometric layer 305, i.e. Ta. In some such embodiments, top electrode layer 309 further includes nitrogen.

In one embodiment, the conductive layer 301 includes ruthenium, conductive layer 307 layer includes a noble metal excluding ruthenium, and the top electrode layer 309 includes Ta, Ti or W or an alloy including nitrogen and at least one of Ta, Ti or W. In second embodiment, conductive layer 301 includes a noble metal excluding ruthenium, conductive layer 307 layer includes a noble metal excluding ruthenium, and the top electrode layer 309 includes Ta, Ti or W or an alloy including nitrogen and at least one of Ta, Ti or W. In a third embodiment, the conductive layer 301 includes a noble metal excluding ruthenium, conductive layer 307 layer includes ruthenium, and the top electrode layer 309 includes Ta, Ti or W or an alloy including nitrogen and at least one of Ta, Ti or W.

Upon deposition of the top electrode layer 309, the RRAM material layer stack 300, may be subjected to a high temperature anneal process. In an embodiment, anneal temperatures reach up to 400° C. and last for a time period of up to 60 minutes. Annealing is a thermal phenomenon that may drive the oxygen from the stoichiometric layer 303, creating oxygen vacancies, $V_o$, in the switching layers. When the non-stoichiometric layer 305 and stoichiometric layer 303 both include Ta, some oxygen from the stoichiometric layer 303 may diffuse toward the non-stoichiometric layer 305 above during the anneal process. The process is insufficient to fully oxidize the non-stoichiometric layer 305.

After annealing the material layer stack 300, a mask 311 is formed on the material layer stack 300. In the illustrative embodiment, the mask 311 is formed on the top electrode layer 309. In some embodiments, the mask 311 is formed by a lithographic process. In other embodiments, the mask 311 includes a dielectric material that has been patterned. The mask 311 defines a size of an RRAM device that will subsequently be formed.

Figure 3D:
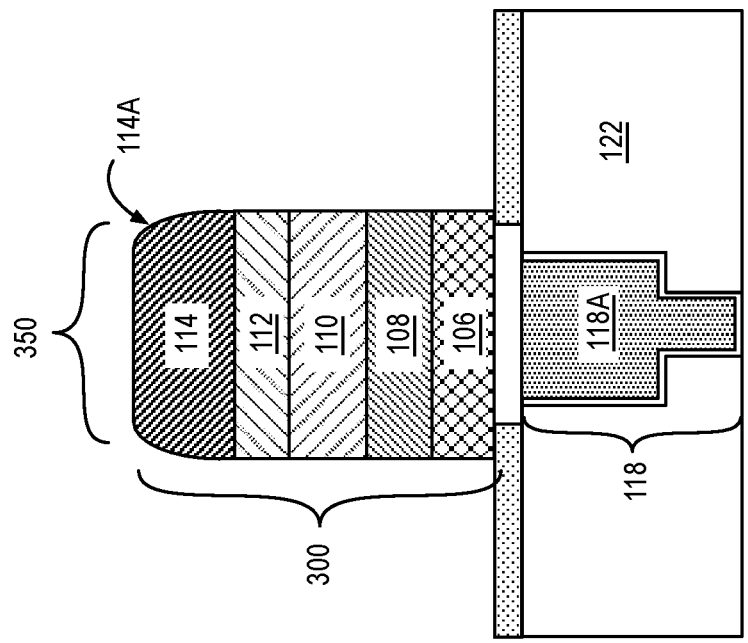
FIG. 3D illustrates the structure of FIG. 3C following an etch process used to etch a plurality of layers of the material layer stack.
Figure 3C:
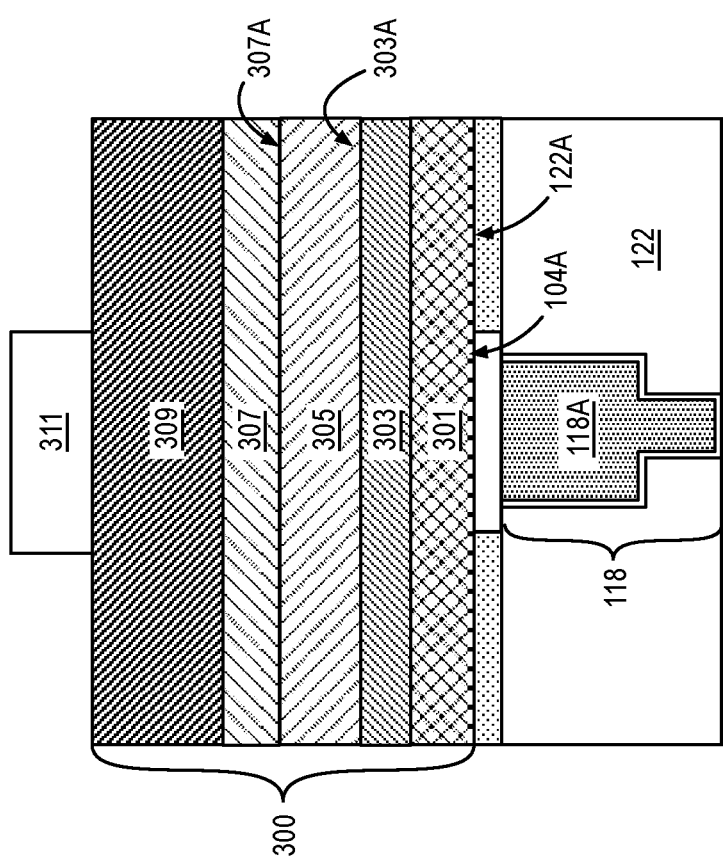
FIG. 3C illustrates the structure of FIG. 3B following the formation of a material layer stack for an RRAM device, on the electrode and on the first dielectric.

FIG. 3D illustrates the structure of FIG. 3C following an etch process used to etch a plurality of layers of the material layer stack 300 to form an RRAM device 350. In an embodiment, an anisotropic plasma etch process is used to pattern the top electrode layer 309 to form a top electrode 114. Portions of the top electrode 114 may be eroded during the etch process resulting in an outmost surface 114A that is curved as shown. The plasma etch is continued to etch the conductive layer 307, the non-stoichiometric layer 305, the stoichiometric layer 303 and the conductive layer 301 to form oxygen exchange layer 110, switching layer 108 and electrode 104, respectively.

In some embodiments, portions of one or more layers of the material layer stack 300 may become damaged by attack from energetic ion species during the plasma etch. In some such embodiments, the anneal process described above can be performed after the plasma etch process is completed.

In an embodiment, the plasma etch may be stopped after etching the conductive layer 301 and exposing the conductive layer 301. A sacrificial spacer may be formed surrounding a portion of a partially patterned material layer stack 300 (above conductive layer 301, for example). The conductive layer 301 may be etched after formation of the spacer. In an embodiment, where the conductive layer 301 includes ruthenium, a plasma etch process may utilize oxygen to pattern the ruthenium. The sacrificial spacer may protect portions of the partially patterned material layer stack 300, such as the oxygen exchange layer 110 from becoming oxidized. After etching the conductive layer 301 to form the bottom electrode 106, the sacrificial spacer may be removed. In such an embodiment, the bottom electrode may protrude laterally beyond the switching layer 108.

Figure 3F:
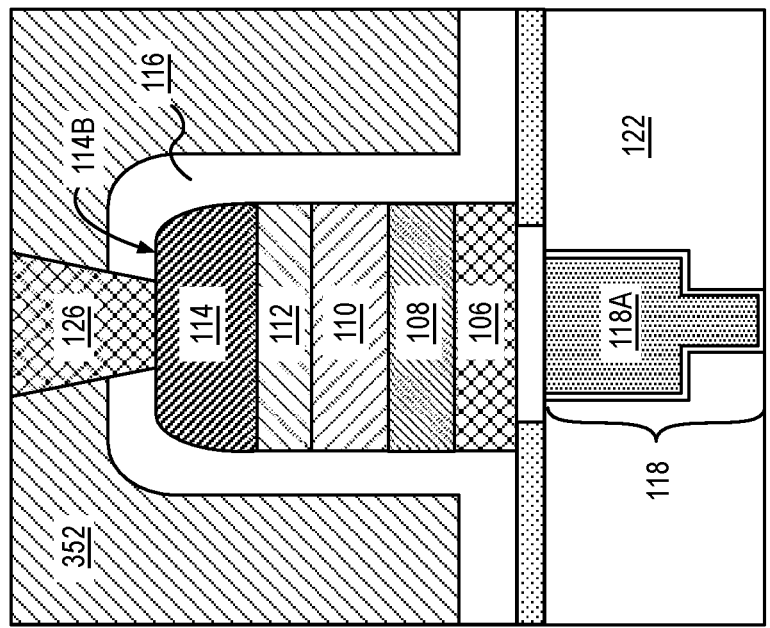
FIG. 3F illustrates the structure of FIG. 3E following the formation of a second dielectric on the dielectric spacer layer and following the formation of a metallization structure on the RRAM device.
Figure 3E:
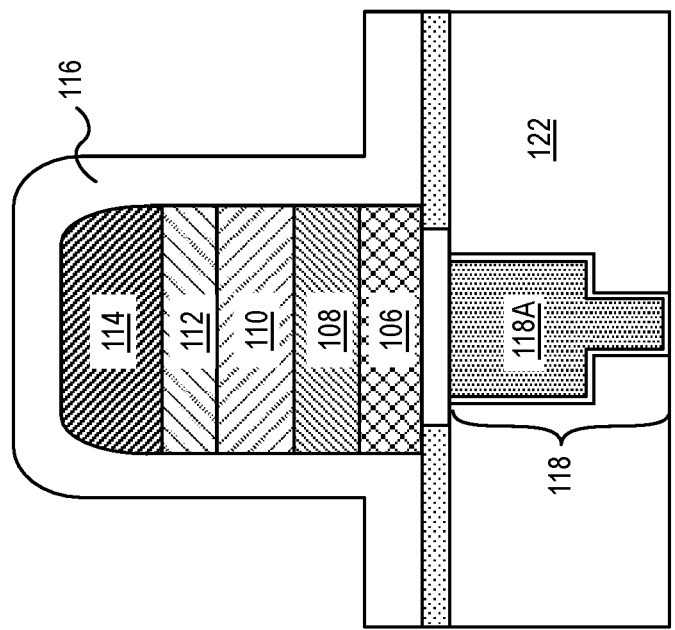
FIG. 3E illustrates the structure of FIG. 3D following the formation of a dielectric spacer layer covering the RRAM device.

FIG. 3E illustrates the structure of FIG. 3D following the formation of a dielectric spacer layer 114 covering the RRAM device 350. The dielectric spacer layer 114 may be blanket deposited by a PVD, PECVD or an ALD process. In some embodiments, the dielectric spacer layer 114 is deposited immediately after forming the bottom electrode 106 and forms a hermetic seal completely around the RRAM device 350, including sidewall and top surfaces. The spacer 116 may be formed on the structure of the RRAM device 350 without breaking vacuum. In an embodiment, the dielectric spacer layer 114 includes a material such as silicon nitride, silicon carbide, carbon-doped silicon nitride, silicon dioxide. In an embodiment, the dielectric spacer layer has a thickness between 5 nm and 50 nm.

FIG. 3F illustrates the structure of FIG. 3E following the formation of a dielectric 352 on the dielectric spacer layer 114 and following the formation of contact metallization 126 on the RRAM device 350. The contact metallization 126 may be formed on the RRAM device 350 after deposition of a dielectric 352 on the RRAM device 350. In an embodiment, a via opening (not shown) may be formed in the dielectric 352. In the illustrative embodiment, the via opening via opening etches a portion of the dielectric spacer layer 114 to expose the top electrode 114. In an embodiment, one or more materials of the contact metallization 126 may be deposited into the via opening and subsequently planarized to form metallization structure 126. Depending on the size of the via opening, the spacer 116 may or may not remain on a top surface 114B of the top electrode 114. In the illustrative embodiment, a portion of the spacer 116 remains on the top surface 114B.

Depending on the choice of materials and on fabrication processes, the RRAM device 350 may include all embodiments of the RRAM device 100A or RRAM device 100B described above.

Figure 4B:
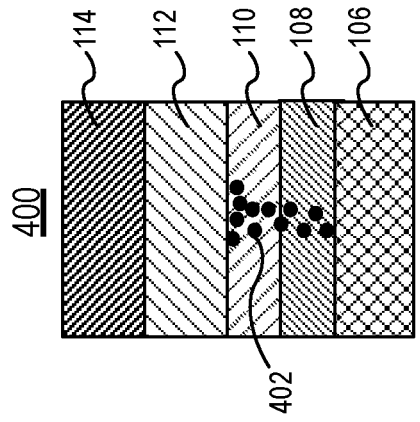
FIG. 4B illustrates a cross-sectional view of a conductive filament formed in an RRAM device, in an accordance with an embodiment of the present disclosure
Figure 4C:
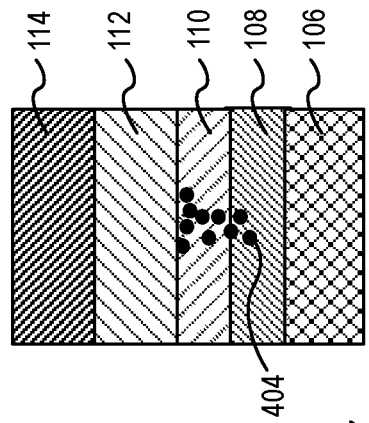
FIG. 4C illustrates a cross-sectional view of an RRAM device where the conductive filament is broken, in an accordance with an embodiment of the present disclosure.
Figure 4A:
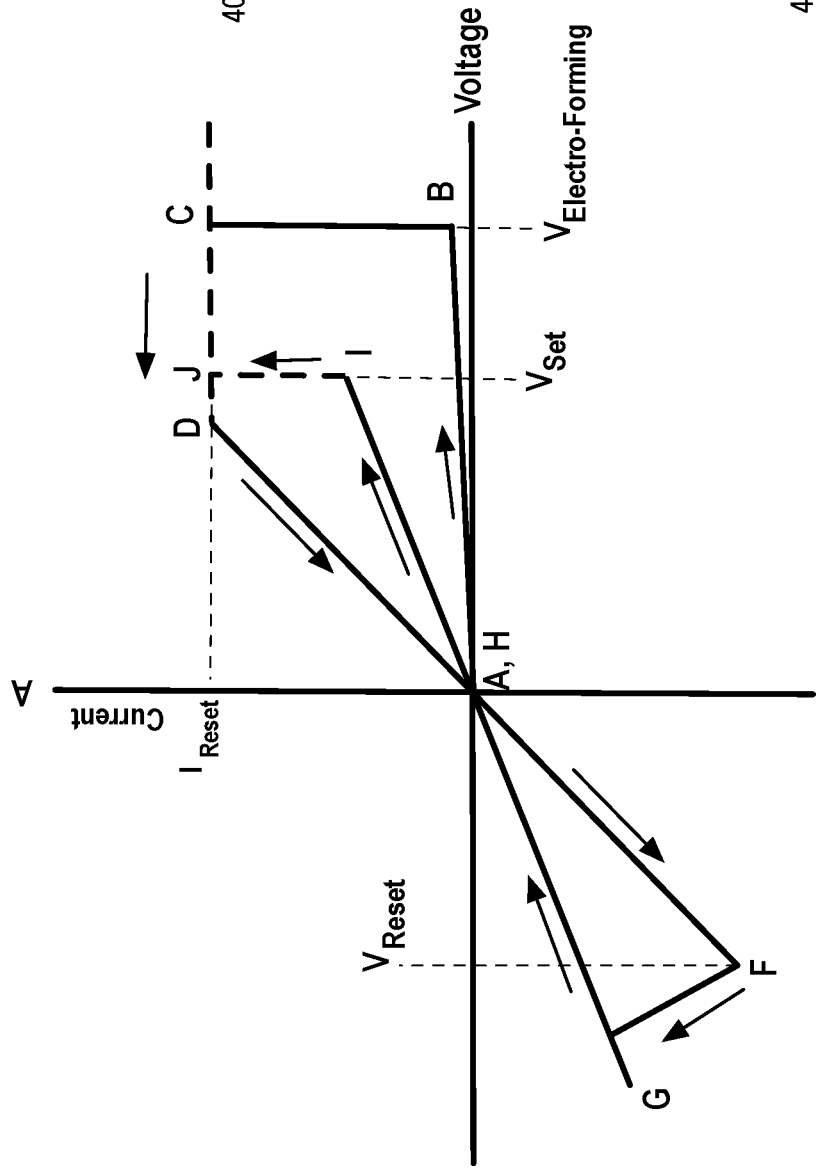
FIG. 4A illustrates an I-V plot, demonstrating concepts involved with filament formation and voltage cycling (reading and writing) in an RRAM device, in accordance with embodiments of the present disclosure.

FIG. 4A illustrates an I-V plot, demonstrating concepts involved with filament formation and voltage cycling (reading and writing) in an RRAM device, such as an RRAM device 400 depicted in FIG. 4B, in accordance with embodiments of the present disclosure. RRAM device 400 is the same or substantially the same as the RRAM device 102 described in association with FIG. 1A. Referring again to FIG. 4A, the initial operation of the RRAM device 400 begins by applying a voltage, between the top electrode 114 and the bottom electrode 104, that increases in magnitude until it reaches a value $V_{Electro-Forming}$ (point A to B). In an embodiment, $V_{Electro-Forming}$ is less than 1.6V. In an "intentional" one-time breakdown process, known as electro-forming, oxygen vacancies, $V_o$, are removed from the oxygen exchange layer 110 into the switching layer 108 and into the switching layer 108 to augment the vacancies created during the anneal process described above. Movement of vacancies in response to an electric field generated in the RRAM device 400 leads to a formation of a "conductive filament" in the switching layer 108. In an embodiment, the conductive filament may extend across switching layer 108 (point B).

FIG. 4B depicts an illustration of a conductive filament 402 in the RRAM device 400, in an accordance with an embodiment of the present disclosure. It is to be appreciated that a size of the conductive filament 402 may be determined by resistance of the RRAM device before the process of electro-forming and by the electroforming voltage. With a conductive filament 402, bridging from the top electrode 114 to the bottom electrode 104, the RRAM device 400 is said to be almost immediately conductive. Referring again to the I-V plot, RRAM device 400 becomes conductive and the current through the RRAM device starts to increase (point B to C), until it reaches a predetermined compliance current, $I_{Comp}$. The current through the RRAM device 400 does not continue to increase beyond $I_{Comp}$. In an embodiment, when the RRAM device is coupled with a transistor, $I_{Comp}$ may be the maximum current that the transistor can deliver to the RRAM device 400. At point C, the RRAM device 400 is in a low resistance state.

By reducing the magnitude of the voltage (while maintaining a positive polarity) between the top electrode 114 and bottom electrode 104 (moving from point C to D and then to point A), causes a reduction in a strength of the electric field. By applying a voltage of an opposite polarity between the top electrode 114 and bottom electrode 104 (moving from point A to F), causes a reversal in a direction of the electric field. In response to the change in the direction of the electric field, the oxygen vacancies move towards the oxygen exchange layer 110, leading to a dissolution of the conductive filament 402 in the switching layer 108 and in the switching layer 108. Filament dissolution takes place at a critical voltage (point F), termed $V_{Reset}$. In an embodiment, $V_{Reset}$ is between −0.8 V and −1.0 V. Increasing the magnitude of the voltage beyond $V_{Reset}$ changes the current flowing through the device.

FIG. 4C depicts an illustration of a dissolved filament 404 in the RRAM device 400, in an accordance with an embodiment of the present disclosure. With a dissolved filament 404, the current through the RRAM device 400 decreases dramatically and the device returns to a high resistance state (point G).

Referring again to the I-V plot in FIG. 4A, it is to be appreciated that the high resistance level of the RRAM device, point G, is different and lower in magnitude compared to the resistance level of the device before the onset of the forming process. In other words, the resistance level of the RRAM device 400 in a high resistance state can be over 10 times smaller than the virgin resistance (discussed above). By decreasing the magnitude of the voltage, traversing from point G to H and then to point I in the I-V plot, the dissolved filament is recreated again (at point I) under the action of vacancy migration. At a critical voltage, $V_{Set}$, the filament completely bridges the top electrode 114 and the bottom electrode 104 and current begins to flow through the RRAM device 400. In an embodiment, $V_{Set}$ is less than 1.0 V. The RRAM device is, once again, said to be in a conductive or a low resistance state (at point J). The filament, that is recreated at point J, may have a size that is comparable to the size of the filament formed during the electro-forming process.

Cycling of an RRAM device 400 in this manner, where the resistance levels remain unchanged when the voltage between the top electrode 114 and the bottom electrode 104 is set to 0V, leads to non-volatile memory effect. By increasing the magnitude of the voltage to at least 0.05V, the resistance state of the RRAM device 400 can be read. In one example, a voltage of 0.05V to 0.2V, referred to as a read voltage, $V_R$, is much less than the switching voltage ($V_{set}$ or $V_{Reset}$) and does not perturb the resistance state of the RRAM device 400. It is to be appreciated that the values $V_{set}$ and $V_{Reset}$, generally refer to a portion of a voltage that may be applied to a transistor in series with the RRAM device 400. The RRAM device 400 coupled with a transistor in this manner is given the term embedded memory.

Figure 5:
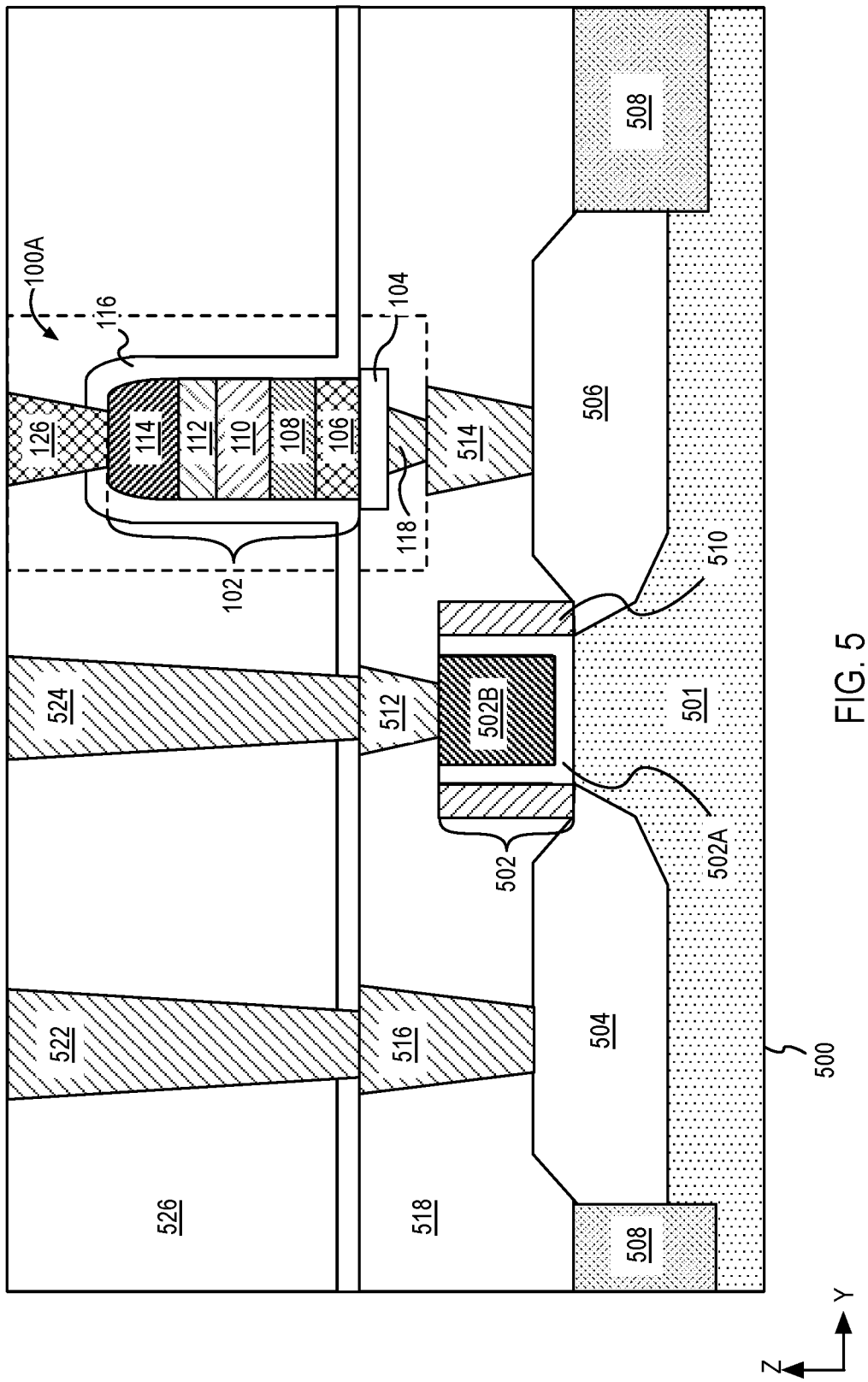
FIG. 5 illustrates a cross-sectional view of an RRAM element coupled to a drain side of a select transistor, in accordance with an embodiment of the present disclosure.

FIG. 5 illustrates a two-terminal spin orbit memory device such as memory apparatus 100A including an RRAM device 102 coupled to an access transistor 500.

In an embodiment, the transistor 500 is on a substrate 501 and has a gate 502, a source region 504, and a drain region 506. In the illustrative embodiment, an isolation 508 is adjacent to the source region 504, drain region 506 and portions of the substrate 501. In some implementations of the disclosure, such as is shown, a pair of sidewall spacers 510 are on opposing sides of the gate 502.

The transistor 500 further includes a gate contact 512 above and electrically coupled to the gate 502, and a drain contact 514 above and electrically coupled to the drain region 506, and a source contact 516 above and electrically coupled to the source region 504, as is illustrated in FIG. 5. The transistor 500 also includes dielectric 518 adjacent to the gate 502, source region 504, drain region 506, isolation 508, sidewall spacers 510, gate contact 512, drain contact 514 and source contact 516.

In an embodiment, the memory apparatus 100A has one or more structural and material properties described above in association with FIG. 1A. In the illustrative embodiment, the memory apparatus 100A includes an RRAM device 102 on a portion of an electrode 104, bottom electrode 106, on the electrode 104, and a switching layer 108 on the bottom electrode 106. The switching layer 108 supports a conductive filament during operation. The switching layer 108 includes a metal and oxygen in substantially stoichiometric proportions. The RRAM device 102 further includes an oxygen exchange layer 110 including the metal and oxygen on the switching layer 108, an electrode 112 on the oxygen exchange layer 110 and a top electrode 114 on the electrode 112. In the illustrative embodiment, the memory apparatus 100A further includes a spacer 116 directly adjacent to the RRAM device, where the spacer 116 includes a dielectric. The electrode 104 is above and coupled with conductive interconnect 118 and adjacent to dielectric 518. In the illustrative embodiment, the conductive interconnect 118 is on and above with the drain contact 514. A contact metallization 126, is coupled with the top electrode 114 as shown. Contact metallization 126 may be connected to one or more circuit elements.

In other embodiments, a memory apparatus having one or more features of memory apparatus 100B may be coupled with the transistor 500.

Gate contact 512 and source contact 516 are each coupled with interconnects. In the illustrative embodiment, gate contact 512 is coupled with a source interconnect 522 and the source contact 516 is coupled with a gate interconnect 524. A dielectric 526 is adjacent to source interconnect 522, gate interconnect 524, memory device 100, source contact 516 and gate contact 512. As shown, the dielectric spacer 116 extends laterally beyond the memory apparatus 100A and over the dielectric 518 to the gate interconnect 524 and source interconnect 522. The dielectric spacer 116 also extends on a portion of the gate contact 512 and source contact 516, as shown.

In an embodiment, the underlying substrate 501 represents a surface used to manufacture integrated circuits. Suitable substrate 501 includes a material such as single crystal silicon, polycrystalline silicon and silicon on insulator (SOI), as well as substrates 501 formed of other semiconductor materials. In some embodiments, the substrate 501 is the same as or substantially the same as the substrate 101. The substrate 501 may also include semiconductor materials, metals, dielectrics, dopants, and other materials commonly found in semiconductor substrates. In an embodiment, the transistor 500 associated with substrate 501 are metal-oxide-semiconductor field-effect transistors (MOSFET or simply MOS transistors), fabricated on the substrate 501. In some embodiments, the transistor 500 is an access transistor 500. In various implementations of the disclosure, the transistor 500 may be planar transistors, nonplanar transistors, or a combination of both. Nonplanar transistors include FinFET transistors such as double-gate transistors and tri-gate transistors, and wrap-around or all-around gate transistors such as nanoril6on and nanowire transistors.

In some embodiments, gate 502 includes at least two layers, a gate dielectric layer 502A and a gate electrode 502B. The gate dielectric layer 502A may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer 502A to improve its quality when a high-k material is used.

The gate electrode 502B of the access transistor 500 of substrate 501 is formed on the gate dielectric layer 502A and may consist of at least one P-type work function metal or N-type work function metal, depending on whether the transistor is to be a PMOS or an NMOS transistor. In some implementations, the gate electrode 502B may consist of a stack of two or more metal layers, where one or more metal layers are work function metal layers and at least one metal layer is a conductive fill layer.

For a PMOS transistor, metals that may be used for the gate electrode 502B include, but are not limited to, ruthenium, palladium, platinum, cobalt, nickel, and conductive metal oxides, e.g., ruthenium oxide. A P-type metal layer will enable the formation of a PMOS gate electrode with a work function that is between about 4.5 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a work function that is between about 3.5 eV and about 4.2 eV.

In some implementations, the gate electrode may consist of a "U"-shaped structure that includes a bottom portion substantially parallel to the surface of the substrate 501 and two sidewall portions that are substantially perpendicular to the top surface of the substrate 501. In another implementation, at least one of the metal layers that form the gate electrode 502B may simply be a planar layer that is substantially parallel to the top surface of the substrate 501 and does not include sidewall portions substantially perpendicular to the top surface of the substrate 501. In further implementations of the disclosure, the gate electrode may consist of a combination of U-shaped structures and planar, non-U-shaped structures. For example, the gate electrode 502B may consist of one or more U-shaped metal layers formed atop one or more planar, non-U-shaped layers.

The sidewall spacers 510 may be formed from a material such as silicon nitride, silicon oxide, silicon carbide, silicon nitride doped with carbon, and silicon oxynitride. Processes for forming sidewall spacers include deposition and etching process operations. In an alternate implementation, a plurality of spacer pairs may be used, for instance, two pairs, three pairs, or four pairs of sidewall spacers may be formed on opposing sides of the gate stack. As shown, the source region 504 and drain region 506 are formed within the substrate adjacent to the gate stack of each MOS transistor. The source region 504 and drain region 506 are generally formed using either an implantation/diffusion process or an etching/deposition process. In the former process, dopants such as boron, aluminum, antimony, phosphorous, or arsenic may be ion-implanted into the substrate to form the source region 504 and drain region 506. An annealing process that activates the dopants and causes them to diffuse further into the substrate typically follows the ion implantation process. In the latter process, the substrate 501 may first be etched to form recesses at the locations of the source and drain regions. An epitaxial deposition process may then be carried out to fill the recesses with material that is used to fabricate the source region 504 and drain region 506. In some implementations, the source region 504 and drain region 506 may be fabricated using a silicon alloy such as silicon germanium or silicon carbide. In some implementations, the epitaxially deposited silicon alloy may be doped in situ with dopants such as boron, arsenic, or phosphorous. In further embodiments, the source region 504 and drain region 506 may be formed using one or more alternate semiconductor materials such as germanium or a group III-V material or alloy. And in further embodiments, one or more layers of metal and/or metal alloys may be used to form the source region 504 and drain region 506.

In an embodiment, the source contact 516, the drain contact 514 and gate contact 512 each include a multi-layer stack. In an embodiment, the multi-layer stack includes two or more distinct layers of metal such as a layer of Ti, Ru or Al and a conductive cap on the layer of metal. The conductive cap may include a material such as W or Cu.

In an embodiment, the source interconnect 522, gate interconnect 524, and contact metallization 126 includes a material that is the same or substantially the same as the material of the conductive interconnect 118.

The isolation 508 and dielectric 518 and 526 may each include any material that has sufficient dielectric strength to provide electrical isolation. Materials may include silicon and one or more of oxygen, nitrogen or carbon such as silicon dioxide, silicon nitride, silicon oxynitride, carbon doped nitride or carbon doped oxide.

Figure 6:
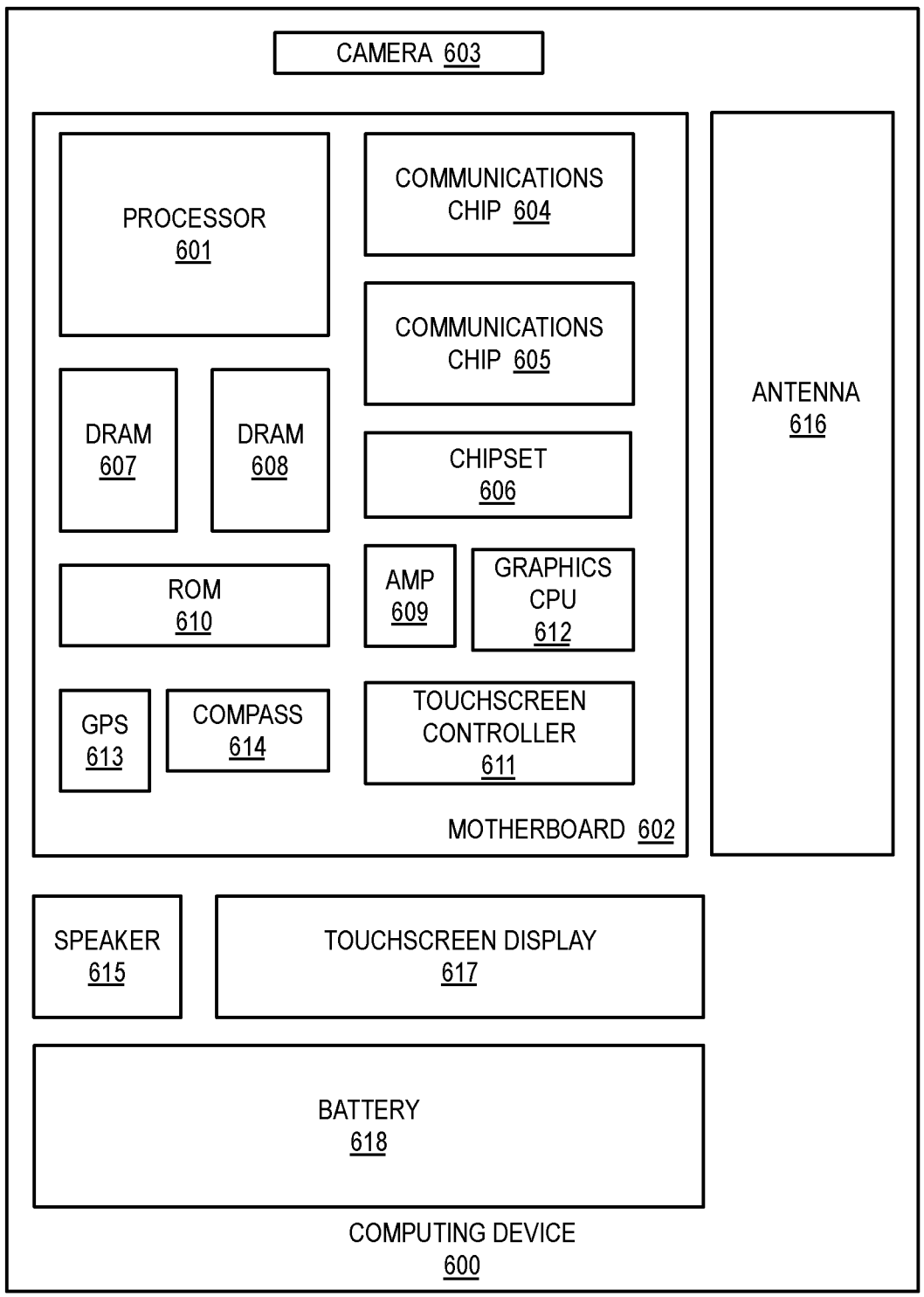
FIG. 6 illustrates a computing device in accordance with embodiments of the present disclosure.

FIG. 6 illustrates a computing device 600 in accordance with embodiments of the present disclosure. As shown, computing device 600 houses a motherboard 602. Motherboard 602 may include a number of components, including but not limited to a processor 601 and at least one communications chip 604 or 605. Processor 601 is physically and electrically coupled to the motherboard 602. In some implementations, communications chip 605 is also physically and electrically coupled to motherboard 602. In further implementations, communications chip 605 is part of processor 601.

Depending on its applications, computing device 600 may include other components that may or may not be physically and electrically coupled to motherboard 602. These other components include, but are not limited to, volatile memory (e.g., DRAM), non-volatile memory (e.g., ROM), flash memory, a graphics processor, a digital signal processor, a crypto processor, a chipset 606, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). In an embodiment, the battery is coupled to power at least one of the processor or the volatile or non-volatile memory.

Communications chip 605 enables wireless communications for the transfer of data to and from computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communications chip 605 may implement any of a number of wireless standards or protocols, including but not limited to Wi-Fi (IEEE 802.11 family), WiMAX (IEEE 802.11 family), long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 600 may include a plurality of communications chips 604 and 605. For instance, a first communications chip 605 may be dedicated to shorter range wireless communications such as Wi-Fi and Bluetooth and a second communications chip 604 may be dedicated to longer range wireless communications such as GPS, EDGE, GPRS, CDMA, WiMAX, LTE, Ev-DO, and others.

Processor 601 of the computing device 600 includes an integrated circuit die packaged within processor 601. In some embodiments, the integrated circuit die of processor 601 includes one or more transistors, interconnect structures, and non-volatile memory devices such as transistor 500, source interconnect 522, gate interconnect 524, contact metallization 126, and conductive interconnect 118, and memory apparatus 100A including RRAM device 102, respectively (FIG. 5). Referring again to FIG. 6, the term "processor" may refer to any device or portion of a device that processes electronic data from registers and/or memory to transform that electronic data into other electronic data that may be stored in registers and/or memory.

Communications chip 605 also includes an integrated circuit die packaged within communication chip 605. In another embodiment, the integrated circuit die of communications chips 604, 605 includes one or more transistors, interconnect structures, non-volatile memory devices, conductive structures and metallization structures such as transistor 500, source interconnect 522, gate interconnect 524, contact metallization 126, and conductive interconnect 118, and memory apparatus 100A including RRAM device 102, respectively (FIG. 5). Referring again to FIG. 6, depending on its applications, computing device 600 may include other components that may or may not be physically and electrically coupled to motherboard 602. These other components may include, but are not limited to, volatile memory (e.g., DRAM) 607, 608, non-volatile memory (e.g., ROM) 610, a graphics CPU 612, flash memory, global positioning system (GPS) device 613, compass 614, a chipset 606, an antenna 616, a power amplifier 609, a touchscreen controller 611, a touchscreen display 617, a speaker 615, a camera 603, and a battery 618, as illustrated, and other components such as a digital signal processor, a crypto processor, an audio codec, a video codec, an accelerometer, a gyroscope, and a mass storage device (such as hard disk drive, solid state drive (SSD), compact disk (CD), digital versatile disk (DVD), and so forth), or the like. In further embodiments, any component housed within computing device 600 and discussed above may contain a stand-alone integrated circuit memory die that includes one or more arrays of NVM devices including one or more memory apparatus each coupled with a transistor.

In various implementations, the computing device 600 may be a laptop, a netbook, a notebook, an Ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device 600 may be any other electronic device that processes data.

Figure 7:
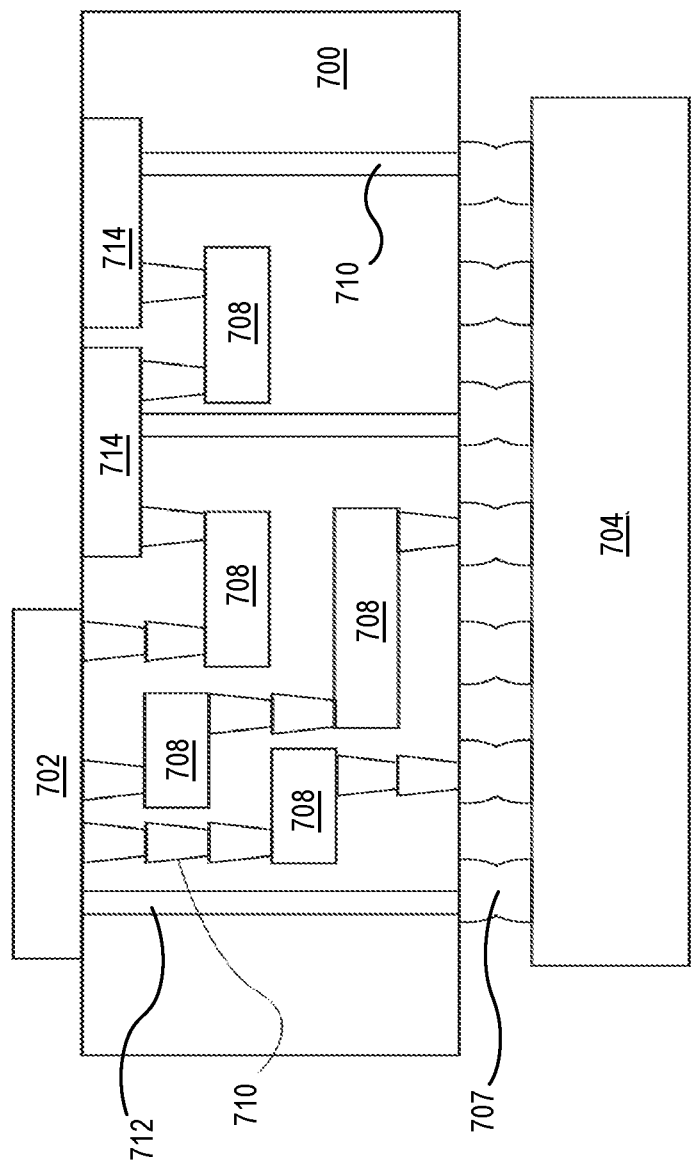
FIG. 7 illustrates an integrated circuit (IC) structure that includes one or more embodiments of the disclosure.

FIG. 7 illustrates an integrated circuit (IC) structure 700 that includes one or more embodiments of the disclosure. The integrated circuit (IC) structure 700 is an intervening substrate used to bridge a first substrate 702 to a second substrate 704. The first substrate 702 may be, for instance, an integrated circuit die. The second substrate 704 may be, for instance, a memory module, a computer mother, or another integrated circuit die. Generally, the purpose of an integrated circuit (IC) structure 700 is to spread a connection to a wider pitch or to reroute a connection to a different connection. For example, an integrated circuit (IC) structure 700 may couple an integrated circuit die to a ball grid array (BGA) 707 that can subsequently be coupled to the second substrate 704. In some embodiments, the first and second substrates 702/704 are attached to opposing sides of the integrated circuit (IC) structure 700. In other embodiments, the first and second substrates 702/704 are attached to the same side of the integrated circuit (IC) structure 700. And in further embodiments, three or more substrates are interconnected by way of the integrated circuit (IC) structure 700.

The integrated circuit (IC) structure 700 may be formed of an epoxy resin, a fiberglass-reinforced epoxy resin, a ceramic material, or a polymer material such as polyimide. In further implementations, the integrated circuit (IC) structure may be formed of alternate rigid or flexible materials that may include the same materials described above for use in a semiconductor substrate, such as silicon, germanium, and other group III-V and group IV materials.

The integrated circuit (IC) structure may include metal interconnects 708 and vias 710, including but not limited to through-silicon vias (TSVs) 712. The integrated circuit (IC) structure 700 may further include embedded devices 714, including both passive and active devices. Such embedded devices 714 include capacitors, decoupling capacitors, resistors, inductors, fuses, diodes, transformers, device structure including transistors, such as transistor 500 (described in FIG. 5) coupled with a memory apparatus 100A including RRAM device 102, in accordance with an embodiment of the present disclosure. Referring again to FIG. 7, the integrated circuit (IC) structure 700 may further include embedded devices 714 such as one or more resistive random-access devices, sensors, and electrostatic discharge (ESD) devices. More complex devices such as radio-frequency (RF) devices, power amplifiers, power management devices, antennas, arrays, sensors, and MEMS devices may also be formed on the integrated circuit (IC) structure 700. In accordance with embodiments of the present disclosure, apparatuses or processes disclosed herein may be used in the fabrication of integrated circuit (IC) structure 700.

Accordingly, one or more embodiments of the present disclosure relate generally to the fabrication of embedded microelectronic memory. The microelectronic memory may be non-volatile, wherein the memory can retain stored information even when not powered. One or more embodiments of the present disclosure relate to the fabrication of a memory apparatus including an RRAM device having a non-stoichiometric oxygen exchange layer above a stoichiometric switching layer. The memory apparatus may be used in an embedded non-volatile memory application.

Thus, embodiments of the present disclosure include RRAM devices and methods of fabrication.

In a first example, memory apparatus includes an interconnect in a first dielectric above a substrate, a structure above the interconnect, where the structure includes a diffusion barrier material. The structure substantially covers the interconnect. A resistive random-access memory (RRAM) device is coupled to the interconnect, the RRAM device includes a first electrode on a portion of the structure, a stoichiometric layer including metal and oxygen on the first electrode, a non-stoichiometric layer including the metal and oxygen on the stoichiometric layer, a second electrode including a barrier material on the non-stoichiometric layer and a third electrode on the second electrode. A spacer is directly adjacent to the RRAM device where the spacer includes a second dielectric.

In second examples, for any of the first example, the first electrode includes a noble metal.

In third examples, for any of the first through second examples the stoichiometric layer and the non-stoichiometric layer each include tantalum.

In fourth examples, for any of the first through third examples, the stoichiometric layer has a chemical composition of $Ta_2O_5$, and wherein the sub-stoichiometric layer has a chemical composition of $Ta_x O_y$, where O is oxygen and wherein the ratio between X and Y is between 1:1.08 to 1:1.2.

In fifth examples, for any of the first through fourth examples, the sub-stoichiometric layer has a gradient in oxygen concentration, where the concentration of oxygen decreases away from an interface between the non-stoichiometric layer and the stoichiometric layer toward the second electrode.

In sixth examples, for any of the first through fifth examples, the stoichiometric layer has a thickness in the range of 2 nm-5 nm, where the non-stoichiometric layer has a thickness in the range of 5 nm-15 nm, and wherein the non-stoichiometric layer has a thickness that is between 2 and 3 times the thickness of the stoichiometric layer.

In seventh examples, for any of the first through sixth examples, the first electrode includes a noble metal, and where the second electrode includes a noble metal.

In eighth examples, for any of the first through seventh examples, the third electrode includes tantalum or an alloy, and where the alloy includes nitrogen and at least one of tantalum, tungsten or titanium.

In ninth examples, for any of the first through eighth examples, the non-stoichiometric layer has a sidewall, and where a portion of the non-stoichiometric layer adjacent to the sidewall is substantially oxidized.

In tenth examples, for any of the first through ninth examples the portion of the non-stoichiometric layer adjacent to the sidewall has a lateral width of less than 3 nm as measured from the sidewall.

In eleventh examples, for any of the first through tenth examples, the third electrode has an outer most sidewall surface, and wherein a portion of the third electrode adjacent to the outmost sidewall surface includes oxygen.

In twelfth examples, for any of the first through eleventh examples, the spacer is on a portion of an uppermost surface of the diffusion barrier, and on an uppermost surface of the third electrode.

In a thirteenth example, for any of the first through twelfth examples, the memory apparatus further includes a metallization structure in contact with a portion of the third electrode.

In a fourteenth example, a memory apparatus includes an interconnect in a dielectric above a substrate, a diffusion barrier on an uppermost surface of the interconnect, where the diffusion barrier has a lowermost surface area that is greater than the uppermost surface area of the interconnect and further where the diffusion barrier covers the interconnect. A resistive random-access memory apparatus is coupled to the interconnect, the RRAM device includes a bottom electrode including ruthenium on a portion of the diffusion barrier, a stoichiometric layer including oxygen and tantalum on the first electrode, layer including tantalum and oxygen on the stoichiometric layer. The layer further includes an inner portion and an outer portion adjacent to the inner portion, where the inner portion is non-stoichiometric and the outer portion is substantially stoichiometric. A barrier electrode is on the layer including the tantalum and oxygen, and a top electrode on the barrier electrode, where the top electrode includes a first portion and a second portion adjacent to the first portion, where the first portion includes tantalum and a second portion includes tantalum and oxygen.

In fifteenth examples, for any of the fourteenth examples, the stoichiometric layer has a chemical composition, $Ta_2O_5$, and wherein the layer including tantalum and oxygen has a chemical composition of $Ta_X O_Y$, where O is oxygen and where the ratio between X and Y is between 1:1.08 to 1:1.2.

In sixteenth examples, for any of the fourteenth through fifteenth examples, the outer portion that is substantially stoichiometric has a thickness between 2 nm to 5 nm. In seventeenth examples, for any of the fourteenth through sixteenth examples, the sub-stoichiometric layer has a gradient in oxygen concentration, and where the concentration of oxygen decreases away from an interface between the non-stoichiometric layer and the stoichiometric layer toward the barrier electrode.

In eighteenth examples, for any of the fourteenth through seventeenth examples, the first electrode has a thickness between 5 nm and 10 nm.

In a nineteenth example, for any of the fourteenth through eighteenth examples, the bottom electrode includes Ru and the second electrode includes a noble metal.

In twentieth examples, for any of the fourteenth through nineteenth examples, the top electrode includes an outermost surface, and where a portion of the top electrode adjacent to the outmost surface includes oxygen.

In twenty first examples, for any of the fourteenth through twentieth examples, the portion of the top electrode adjacent to the outer most surface including oxygen has a lateral thickness that correlates with a vertical thickness of the bottom electrode, where the lateral thickness is orthogonal to the vertical thickness, and where the vertical thickness is measured from an interface between an uppermost surface of the diffusion barrier and a lowermost surface of the bottom electrode.

In a twenty second example, a system includes a processor, a radio transceiver coupled to the processor, where the transceiver includes a transistor. The transistor includes a drain contact coupled to a drain, a source contact coupled to a source and a gate contact coupled to a gate. The radio transceiver further includes a resistive random-access memory (RRAM) device coupled with the drain contact, the RRAM device includes a first electrode above the drain contact, a stoichiometric layer including metal and oxygen on the first electrode, a non-stoichiometric layer including the metal and oxygen on the stoichiometric layer, a second electrode on the sub-stoichiometric layer and a third electrode on the barrier electrode. A spacer directly is adjacent to the RRAM device, where the spacer includes a second dielectric.

In twenty third examples, for any of the twenty second examples, the system further includes a battery coupled to power at least one of the processor or memory.

What is claimed is:

1. A memory apparatus, comprising:
   an interconnect in a first dielectric above a substrate;
   a structure above the interconnect, wherein the structure comprises a diffusion barrier material, and wherein the structure substantially covers the interconnect;
   a resistive random-access memory (RRAM) device coupled to the interconnect, the RRAM device comprising:
      a first electrode on a portion of the structure;
      a stoichiometric layer comprising tantalum and oxygen on the first electrode;
      a non-stoichiometric layer on the stoichiometric layer, wherein the non-stoichiometric layer has a chemical composition of $Ta_X O_Y$ with a ratio of X:Y between 1:1.08 and 1:1.2;
      a second electrode comprising a barrier material on the non-stoichiometric layer; and
      a third electrode on the second electrode; and
   a spacer directly adjacent to the RRAM device, wherein the spacer comprises a second dielectric.

2. The memory apparatus of claim 1, wherein the first electrode comprises a noble metal.

3. The memory apparatus of claim 1, wherein the stoichiometric layer and the non-stoichiometric layer each comprise tantalum.

4. The memory apparatus of claim 3, wherein the stoichiometric layer has a chemical composition of $Ta_2O_5$.

5. A system comprising:
   a processor;
   a radio transceiver coupled to the processor, wherein the radio transceiver includes a transistor comprising:
      a drain contact coupled to a drain;
      a source contact coupled to a source; and
      a gate contact coupled to a gate; and
   the resistive random-access memory (RRAM) device of claim 1.

6. A memory apparatus, comprising:
   an interconnect in a first dielectric above a substrate;
   a structure above the interconnect, wherein the structure comprises a diffusion barrier material, wherein the structure substantially covers the interconnect;
   a resistive random-access memory (RRAM) device coupled to the interconnect, the RRAM device comprising:
      a first electrode on a portion of the structure;
      a stoichiometric layer comprising a metal and oxygen on the first electrode;
      a non-stoichiometric layer comprising the metal and oxygen on the stoichiometric layer;
      a second electrode comprising a barrier material on the non-stoichiometric layer; and a third electrode on the second electrode; and a spacer directly adjacent to the RRAM device, wherein the spacer comprises a second dielectric, wherein the non-stoichiometric layer has a gradient in oxygen concentration and wherein the concentration of oxygen decreases with distance away from an interface between the non-stoichiometric layer and the stoichiometric layer toward the second electrode.

7. The memory apparatus of claim 6, wherein the stoichiometric layer has a thickness in the range of 2 nm-5 nm, wherein the non-stoichiometric layer has a thickness in the range of 5 nm-15 nm, and wherein the non-stoichiometric layer has a thickness that is between 2 and 3 times the thickness of the stoichiometric layer.

8. The memory apparatus of claim 6, wherein the first electrode comprises a noble metal, and wherein the second electrode comprises a noble metal.

9. The memory apparatus of claim 6, wherein the third electrode comprises tantalum or an alloy of at least one of: tantalum, tungsten or titanium.

10. The memory apparatus of claim 6, wherein the non-stoichiometric layer has a sidewall, and wherein a portion of the non-stoichiometric layer adjacent to the sidewall is substantially oxidized.

11. The memory apparatus of claim 10, wherein the portion of the non-stoichiometric layer adjacent to the sidewall has a lateral width of less than 3 nm as measured from the sidewall.

12. The memory apparatus of claim 6, wherein the third electrode has an outer most sidewall surface, and wherein a portion of the third electrode adjacent to the outmost sidewall surface includes oxygen.

13. A system comprising:
a processor;
a radio transceiver coupled to the processor, wherein the radio transceiver includes a transistor comprising:
a drain contact coupled to a drain;
a source contact coupled to a source; and
a gate contact coupled to a gate; and
the resistive random-access memory (RRAM) device of claim 6.

14. A memory apparatus, comprising:
an interconnect in a dielectric above a substrate;
a diffusion barrier on an uppermost surface of the interconnect, wherein the diffusion barrier has a lowermost surface area that is greater than the uppermost surface area of the interconnect and further wherein the diffusion barrier covers the interconnect; and
a resistive random-access memory apparatus coupled to the interconnect, the RRAM device comprising:
a bottom electrode comprising ruthenium on a portion of the diffusion barrier;
a stoichiometric layer comprising oxygen and tantalum on the bottom electrode;
a layer comprising tantalum and oxygen on the stoichiometric layer, the layer further comprising:
an inner portion; and
an outer portion adjacent to the inner portion, wherein the inner portion is non-stoichiometric and the outer portion is substantially stoichiometric;
a barrier electrode on the layer comprising the tantalum and oxygen; and
a top electrode on the barrier electrode, the top electrode comprising a first portion and a second portion adjacent to the first portion, wherein the first portion comprises tantalum and a second portion comprises tantalum and oxygen.

15. The memory apparatus of claim 14, wherein the stoichiometric layer has a chemical composition, $Ta_2O_5$, and wherein the layer comprising tantalum and oxygen has a chemical composition of $Ta_X O_Y$, where O is oxygen and wherein the ratio between X and Y is between 1:1.08 to 1:1.2.

16. The memory apparatus of claim 14, wherein the outer portion that is substantially stoichiometric has a thickness between 2 nm to 5 nm.

17. The memory apparatus of claim 14, wherein the inner portion of the layer comprising tantalum and oxygen has a gradient in oxygen concentration, and wherein the concentration of oxygen decreases away from an interface between the inner portion and the stoichiometric layer toward the barrier electrode.

18. The memory apparatus of claim 14, wherein the first electrode has a thickness between 5 nm and 10 nm.

19. The memory apparatus of claim 14, wherein the bottom electrode comprises Ru and the second electrode comprises a noble metal.

20. The memory apparatus of claim 14, wherein the top electrode comprises an outermost surface, wherein a portion of the top electrode adjacent to the outmost surface comprises oxygen, wherein the portion of the top electrode adjacent to the outer most surface comprising oxygen has a lateral thickness that correlates with a vertical thickness of the bottom electrode, wherein the lateral thickness is orthogonal to the vertical thickness, and wherein the vertical thickness is measured from an interface between an uppermost surface of the diffusion barrier to a lowermost surface of the bottom electrode.

* * * * *